United States Patent [19]

Yamamoto et al.

[11] Patent Number: 5,788,766
[45] Date of Patent: *Aug. 4, 1998

[54] WINDOW AND PREPARATION THEREOF

[75] Inventors: Yoshiyuki Yamamoto; Keiichiro Tanabe; Katsuko Harano; Takashi Tsuno; Nobuhiro Ota; Naoji Fujimori. all of Itami, Japan

[73] Assignee: Sumitomo Electric Industries, Ltd.. Osaka, Japan

[*] Notice: The term of this patent shall not extend beyond the expiration date of Pat. No. 5,785,754.

[21] Appl. No.: 565,595

[22] Filed: Nov. 30, 1995

[30] Foreign Application Priority Data

| Nov. 30, 1994 | [JP] | Japan | 6-296351 |
| Dec. 22, 1994 | [JP] | Japan | 6-319964 |
| Dec. 22, 1994 | [JP] | Japan | 6-319971 |
| Dec. 22, 1994 | [JP] | Japan | 6-319976 |

[51] Int. Cl.$^6$ .................................................. C30B 29/05
[52] U.S. Cl. ..................... 117/89; 117/94; 117/95; 117/929
[58] Field of Search .................. 117/89, 94, 95, 117/929

[56] References Cited

U.S. PATENT DOCUMENTS

| 5,235,239 | 8/1993 | Jacob et al. | 313/363.1 |
| 5,284,709 | 2/1994 | Herb et al. | 428/408 |
| 5,344,526 | 9/1994 | Nishibayashi et al. | 156/643 |
| 5,355,425 | 10/1994 | Braiman et al. | 385/31 |
| 5,450,047 | 9/1995 | Jory | 333/252 |

FOREIGN PATENT DOCUMENTS

| 0 089 722 | 9/1983 | European Pat. Off. |
| 0 532 184 | 3/1993 | European Pat. Off. |
| 0 567 129 | 10/1993 | European Pat. Off. |
| 2 122 926 | 1/1984 | United Kingdom. |

OTHER PUBLICATIONS

Ramesham et al. "Fabrication of Microchannels in Synthetic Polycrystalline Diamond Thin Films for Heat Sinking Applications". Journal of the Electrochemical Society vol. 138 No. 6, Jun. 1991.

Seal. "Thermal and Optical Applications of Thin Film Diamond". Philosophical Transactions of the Royal Society of London, Series A (Physical Sciences and Engineering), Feb. 15, 1993, vol. 342, No. 1164, pp. 313–322.

Bilderback. "Fabricating Rectangular Internal Coding Channels in Silicon X–Ray Monochromator Optics". Review of Scientific Instruments, vol. 60, No. 7, Part2A, Jul. 1989, pp. 1977 an 1978.

Smither. "Summary of a Workshop on High Heat Load X–Ray Optics Held at Argonne International Laboratory", Nuclear Instruments & Methods in Physics Research, Section–A: Accelerators, Spectrometers, Detectors and Associated Equipment, vol. A291, No. 1/02, May 20, 1990, pp. 286–299.

Nogi et al., "Wettability of Diamond by Liquid Pure Metals", Materials Transactions, JIM, vol. 35, No. 2 (1994), pp. 156–160.

Wahl et al., "Water Cooled Silicon Crystals for X–Ray Monochromators", Nuclear Instruments & Methods is Physics Research, Section–A: Accelerators, Spectrometers, Detectors and Associated Equipment, vol. A318, No. 1/3, Jul. 1, 1992, pp. 908–913.

Patent Abstracts of Japan, vol. 013, No. 366 (E–806), Aug. 15, 1989 & JP–A–01 123423 (Sumitomo Electric Ind Ltd), May 16, 1989.

*Primary Examiner*—Robert Kunemund
*Attorney, Agent, or Firm*—Pillsbury Madison & Sutro LLP

[57] ABSTRACT

A window material, which has a high thermal conductivity material layer having a thermal conductivity of at least 10 W/cm·K and which has a cooling medium flow path on or in the high thermal conductivity material layer, has a high heat-dissipating property and a high transmittance.

32 Claims, 6 Drawing Sheets

WINDOW AND PREPARATION THEREOF

FIELD OF THE INVENTION

The present invention relates to a window (or aperture) and a method of preparing the window. The window of the present invention has a high ray transmittance, a high heat dissipation property and a high heat resistant property and, for example, can be used for a radiation, an infra-red light and an ultra-violet light.

RELATED ART

Various optical window materials such as a window material used for a radiation experiment system, for example, using a synchrotron radiation (SOR radiation) are required to have a higher intensity of transmitted ray and are used under a severer conditions year by year. Therefore, it is supposed that the window material is required to have a higher mechanical strength and radiation resistant property in future.

Examples of the presently used materials for various transmitting window are Be, Al, Si, ZnSe and the like. These window materials have generally a low thermal conductivity. When a large energy is supplied to the these window materials, these window materials have an elevated temperature so as to give a problem of melting or deterioration. Therefore, a range of applied energy is limited. A procedure of cooling the window material from a circumference of the window material and other procedures are conducted to prevent a temperature increase of the window material. However, these procedures are not satisfactory.

SUMMARY OF THE INVENTION

The inventors of the present application intensively studied to solve the above problems and to have a window material having a high cooling efficiency and a good transmittance in a wide range, and discovered that the formation of a flow path for directly passing a coolant through a material having a high thermal conductivity gives a window material having a remarkably improved heat-dissipation property in comparison with a prior art window material.

The present invention provides a window material comprising a layer of a high thermal conductivity material having a thermal conductivity of at least 10 W/cm·K and positioned on a base material, wherein a flow path for passing a cooling medium (or refrigerant) is provided on the high thermal conductivity material layer adjacent an interface between the base material and the high thermal conductivity material layer.

The present invention provides a window material comprising at least one flow path for passing a cooling medium which is embedded in a plate made of a high thermal conductivity material having a thermal conductivity of at least 10 W/cm·K.

The present invention provides a method of preparing a window material which comprises steps of a) conducting a laser light treatment on one main surface of a plate comprising a high thermal conductivity material having a thermal conductivity of at least 10 W/cm·K to form a flow path for passing a cooling medium on said surface, and b) adhering said treated surface to a base material.

The present invention provides a method of preparing a window material which comprises steps of a) conducting a laser light treatment on one main surface of a plate comprising a high thermal conductivity material having a thermal conductivity of at least 10 W/cm·K to form a flow path for passing a cooling medium on said surface, and b) adhering said treated surface to another plate comprising a high thermal conductivity material having a thermal conductivity of at least 10 W/cm·K.

The present invention provides a method of preparing a window material which comprising step of conducting a laser light treatment on a side surface of a plate comprising a high thermal conductivity material having a thermal conductivity of at least 10 W/cm·K to form a flow path for passing a cooling medium.

The present invention provides a method of preparing a window material which comprises steps of a) providing a mask partially on one main surface of a plate comprising a high thermal conductivity material having a thermal conductivity of at least 10 W/cm·K, b) selectively etching a portion having no mask to form a flow path for passing a cooling medium, c) removing the mask, and d) adhering the etched surface to a base material.

The present invention provides a method of preparing a window material which comprises steps of a) forming a groove on a plate material, b) growing diamond by a vapor phase deposition on the plate material, c) removing the plate material to give a grooved self-standing diamond film, and d) adhering the grooved surface of the diamond film to a base material.

The present invention provides a method of preparing a window material which comprises steps of a) providing a mask on a base material, b) growing diamond by a vapor phase deposition on the base material, and c) removing the mask to give a flow path for passage of a cooling medium.

The present invention provides a method of preparing a window material which comprises steps of a) providing a mask on a plate material, b) growing diamond by a vapor phase deposition on the plate material, c) removing the mask and the plate material to give a grooved self-standing diamond film, and d) adhering the grooved surface of the diamond film to a base material.

DETAILED DESCRIPTION OF PREFERRED EMBODIMENTS

Figure 1:
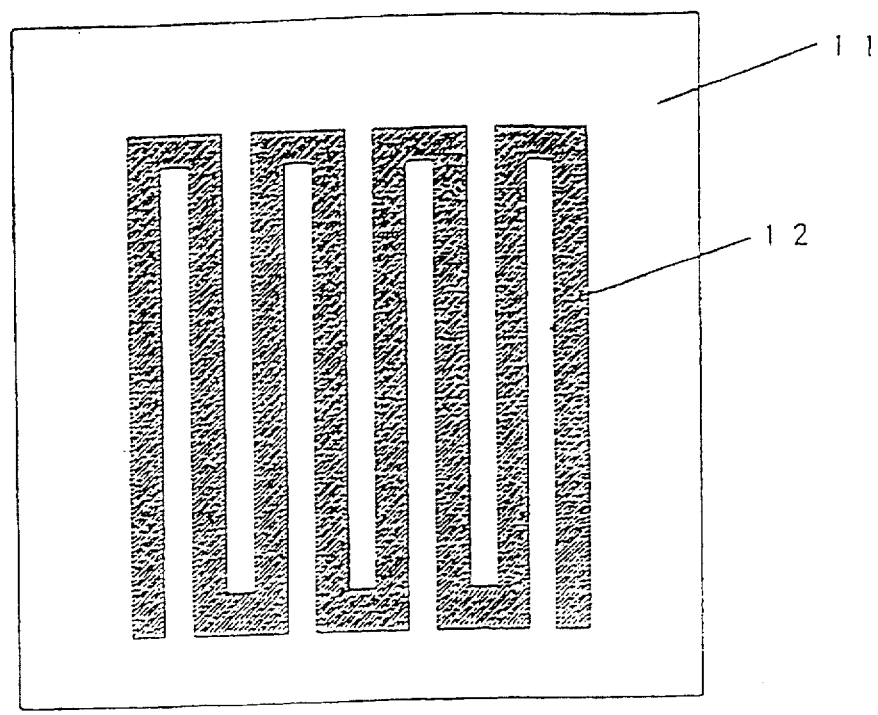
FIG. 1 is a schematic plane view of a grooved high thermal conductivity material layer according to the present invention.

The present invention will be explained in detail.

In one embodiment of the window material of the present invention, the high thermal conductivity material layer is laminated on the base material, and the groove (namely, a flow path or a channel) for passing the cooling medium is formed in high thermal conductivity material layer at the interface between the high thermal conductivity material layer and the base material. The heat evolved during the transmittance of ray in the window material is transmitted into the high thermal conductivity material layer at a small temperature gradient and removed by the cooling medium passing through the groove formed on the high thermal conductivity material back surface.

The high thermal conductivity material layer preferably has a higher thermal conductivity, since the window temperature can be significantly decreased. The thermal conductivity is preferably as large as possible, and is suitably at least 10 W/cm·K. Specific examples of the high thermal conductivity material are natural diamond, synthetic diamond by a high pressure and high temperature method and chemical vapor deposited (CVD) diamond. These are suitable for the high thermal conductivity material layer. When diamond prepared by the chemical vapor deposition, the high thermal conductivity material layer having a relatively large area can be obtained at a cheap price. The thermal conductivity generally depends on the temperature. The thermal conductivity of diamond decreases, as the temperature increases in the range above the room temperature.

Since the window material is used for the SOR radiation, a conventional window material itself has a temperature increase to about 200° to 500° C. since the irradiated energy is very large. Even if diamond is used, a thermal conductivity of diamond remarkably decreases. However, since the use of the window material of the present invention can give a high heat-dissipating property, a temperature increase of the window material can be prevented and a high thermal conductivity can be maintained. The thickness of the high thermal conductivity material layer is preferably at least 30 μm, more preferably at least 70 μm. The upper limit of the thickness of the high thermal conductivity material layer is usually 10 mm, for example 5 mm.

The depth of the groove present in the high thermal conductivity material is preferably larger due to the increase of the heat exchange efficiency, but the very large depth of the groove disadvantageously gives the poor mechanical strength. The depth (c) of the groove is preferably at least 20 μm, more preferably at least 50 μm. The depth (c) of the groove is preferably at most 90%, more preferably at most 80%, for example at most 70% of the high thermal conductivity material layer thickness. The larger width (a) of the groove gives the larger heat exchange efficiency, but the very large width gives the smaller heat exchange efficiency due to the decreased number of the grooves for maintaining the strength of the part contacting the base material. The space (b) between the grooves is in the same manner as in the width, and the very large or small space disadvantageously gives the poor results. The width (a) of the groove and the space (b) between the grooves are preferably from 20 μm to 10 mm, more preferably from 40 μm to 2 mm, most preferably from 50 μm to 2 mm. The ratio (a/b) of the width (a) to the space (b) has the lower limit of preferably 0.02, more preferably 0.04 and the upper limit of preferably 10, more preferably 5. The ratio (a/c) of the width (a) to the depth (c) has the lower limit of preferably 0.02, more preferably 0.05 and the upper limit of preferably 50, more preferably 25 (cf. FIG. 7).

The optimum width, space and width are dependent on the ray transmitted through the window material. The cross-sectional shape of the groove need not be rectangular and may be a semicircular, semioval or complicated shape. In one window material, the values of a, b and c may not be constant and can be varied in the above range. The ratio of high thermal conductivity material layer surface occupied by the groove is usually 2 to 75%, preferably 10 to 50% of the surface area of high thermal conductivity material layer. A angle (taper angle) between the side surface of the groove and the line normal to the high thermal conductivity material layer surface is preferably at most 30°.

The groove for passing the cooling medium can be suitably formed according to the exothermal state of the window material. The groove is preferably formed so that a part having the highest temperature or a part required to have the lowest temperature is most effectively cooled. The groove is positioned so that the largest amount of the cooling medium passes through a part required to be most largely cooled. The cooling efficiency can be increased by complicating the cross-sectional shape of the groove so as to increasing the surface area of the groove. A part near an inlet for the cooling medium has a high cooling efficiency, since the cooling medium has the lowest temperature. Accordingly, when a heat distribution of the window material is uniform, since a center part has the highest temperature, it is advantageously effective that the inlet is formed in the center part and the cooling groove is positioned in a spiral or radial shape.

The groove can be formed by processing the high thermal conductivity material layer by a laser process (for example, the use of excimer laser) or an etching process.

A layer of non-diamond carbon component (for example, graphite or noncrystalline carbon) having the thickness of 1 nm to 1 μm may be present on the surface of the groove. The non-diamond layer can be prepared by heating the high thermal conductivity material layer at 1000°–1500° C. for 30 minutes to 10 hours (for example, 1 hour) in a non-oxidation atmosphere (for example, in an inert gas atmosphere) (In this case, the non-diamond layer is also formed on the surface of the high thermal conductivity other than groove, and the non-diamond layer can be removed by a polishing process). The presence and absence of the non-diamond layer can be measured by Raman spectroscopy.

Wettability of the groove surface by the cooling medium is preferably good. A contact angle is usually at most 65０, more preferably at most 60０. Since a surface of diamond has a hydrogen atom. the surface repels the cooling medium such as water in such state. It is possible to increase the hydrophilic property of the diamond surface layer by substituting the hydrophilic group having the oxygen atom (for example. OH group) for the hydrogen atom.

In order to increase the wettability of the groove surface, the groove is annealed at 500°–800° C. for 10 minutes to the 10 hours in an oxidation atmosphere (for example, an atmospheric environment) or processed by a plasma of oxygen or a gas containing oxygen. It is supposed that the hydrophilic property is somewhat increased when an oxygen plasma is used for the formation of the groove, but the above procedure may be additionally conducted.

The process for improving the wettability of the groove surface by the cooling medium includes a plasma treatment in a gas containing nitrogen, boron or inert gas.

After the groove is formed, the high thermal conductivity material layer is adhered to the base material. The adhesion may be conducted by a metal, an adhesive or the like. The thickness of the metal or adhesive layer is usually from 0.01 to 10 µm. Alternatively, the adhesion may be conducted without a material such as the metal, and the high thermal conductivity material layer may be adhered directly to the base material.

The base material may be Be, Al and the like for a X-ray transmitting window, and Si, ZnSe and the like for an infra-red light transmitting window.

The base material may be a plate. The thickness of the base material is usually from 0.1 mm to 10 mm, preferably from 0.5 mm to 5 mm.

Specific examples of the cooling medium are water, air, an inert gas (for example, nitrogen and argon), a fluorocarbon, liquid nitrogen, liquid oxygen, and liquid helium.

The window of the present invention can be used as a transmitting window for an infra-red light, an ultra-violet light, a X-ray, a SOR radiation and the like.

When the ray is transmitted through the window material, the high thermal conductivity material is preferably positioned on an incident side of the window material. However, the base material may be positioned on the incident side of the window material.

Hereinafter, a method for preparing the window material having the groove for the flow of the cooling medium at the interface between the base material and the high thermal conductivity material layer is explained.

Firstly, a method for adhering the base material to the high thermal conductivity material layer having the groove for flow of the cooling medium is illustrated. A material forming the high thermal conductivity material layer is provided in a desired size. The groove for flow of the cooling medium can be prepared by a processing method utilizing a laser light or by a selective etching.

The laser processing comprises removing the material by focusing the laser light on the material surface to form the groove on the surface. According to this process, the groove having the arbitrary positioning can be obtained. The laser light having sufficient energy density is focused on the surface of the high thermal conductivity material and the focused position is moved while removing the material to form the groove on the surface. Specific examples of the laser light are YAG laser and excimer laser. The excimer laser is preferable, since the groove having the arbitrary depth and position can be reproductively formed in view of the processing preciseness.

The wave length of the laser light is preferably at most 360 nm, for example 190 to 360 nm. The energy density of the irradiated light is usually from 10 to $10^{11}$ W/cm$^2$. A pulse laser light, which preferably has an energy density per one pulse between $10^{-1}$ J/cm$^2$ and $10^{6}$ J/cm$^2$ is preferable. The divergence of the laser light generated from the laser generator is preferably from $10^{-2}$ mrad to $5×10^{-1}$ mrad, and a band width of the laser light is preferably from $10^{-4}$ nm to 1 nm. A uniformity of the energy distribution in the beam cross-section of the laser light is preferably at most 10%. Good process results can be obtained by focusing the pulse laser light by a cylindrical lens or a cylindrical mirror.

In such groove formation on the surface by the excimer laser, the processing in the suitable atmosphere can modify the diamond surface and can improve the wettability of the surface by the cooling medium. For example, the above processing in the atmosphere containing an amino group-containing compound (for example, ammonia or hydrazine) can give the amino group on the surface of the formed groove to increase the hydrophilic property.

The groove formation by the etching process can be conducted as follows. After a suitable mask is formed on the high thermal conductivity material layer, the treatment is conducted under the condition that the mask is not etched and only the high thermal conductivity material is etched. Then the mask is removed to give the high thermal conductivity material layer having the groove on the surface. It is known that the mask material such as Al and SiO$_2$ is formed on diamond and then diamond is selectively etched by oxygen or a gas containing oxygen to form the groove on diamond (cf. page 411 of volume 11 of Preprint of 53th meeting of the Japanese Applied Physics Society). Nitrogen or hydrogen may be used instead of oxygen or the gas containing oxygen.

The high thermal conductivity material layer having the desired groove is adhered to the separately provided base material to give the window material having the very large heat dissipation efficiency. The base material may provisionally have an inlet and outlet for introducing (and discharging) the cooling medium into the groove formed in the high thermal conductivity material layer.

The adhesion of the high thermal conductivity material layer to the base material can be conducted by a metallization treatment or an adhesive. Two adhered surfaces may be metallized by a conventional procedure and the metal may be molten. Specific examples of the metal used in the metallization treatment are Ti, Pt, Au, Sn, Pb, In, Ag and the like. The adhesive (for example, Ag/epoxy, Ag/polyimide and Au/epoxy) or Ag-based wax and other adhesion method may be used. The thickness of the adhesive layer is usually from 0.01 to 10 µm.

When the high thermal conductivity material layer is diamond prepared by the chemical vapor deposition process, the selective growth using a mask can be used to form the groove instead of the laser light or etching process. This is disclosed in Japanese Patent Kokai Publication Nos. 104761/1989 and 123423/1989. A mask material is positioned on the surface of the base material (for example, Si, SiC, Cu, Mo, cBN and the like) in the pattern corresponding to the desired groove, and diamond is deposited by the chemical vapor deposition. At this time, diamond grows in the vertical and horizontal directions by depositing at least 50 µm of diamond and covers the whole surface of the base material. After the base material is removed, for example, dissolved, the resultant diamond has the groove on the surface facing the base material. The mask made of Ti, Si, Mo or the like may be prepared by a conventional procedure. The advantage of this method is that diamond does not have a failure at the processing, since the impact is not applied to diamond after the growth of diamond.

In the above method, instead of the formation of the mask, the plate material itself is processed to form the concave and convex corresponding to the groove and then diamond is grown on the plate material by the chemical vapor deposition. After diamond having the desired thickness is grown, the plate material is removed to give the self-standing diamond film having the groove on the surface facing the plate material. Specific examples of the plate material are Si, SiC, Mo and the like.

When the chemical vapor deposited diamond is used as the high thermal conductivity material layer, the above method is modified so that the step of adhesion can be omitted. Namely, the mask is positioned on the base material, diamond is grown on the base material by the chemical vapor deposition and then only the mask is dissolved to give the window material having the groove for flow of the cooling medium in the diamond at the interface between the base material and diamond. According to this method, the heat-dissipation efficiency can be further increased, since the adhesive is absent. Specific examples of the preferable base material are Si, SiC, Cu and Mo.

Any of the above methods is effective to prepare the window material having the groove in the high thermal conductivity material layer at the interface between the high thermal conductivity and the base material. The method using the etching can precisely form the fine groove. The method using the laser processing can rapidly form the groove. The method using the selective growth (the method using the mask) can easily form the relatively large groove.

In the other embodiment of the window material of the present invention, the top, bottom and sides of the flow path is surrounded by the high thermal conductivity material. The heat evolved during the transmittance of ray through the window material is transmitted into the high thermal conductivity material at a small temperature gradient and removed by the cooling medium passing through the flow path.

The high thermal conductivity material preferably has a higher thermal conductivity, since the window material temperature can be significantly decreased. The thermal conductivity of the high thermal conductivity material is preferably as large as possible, and is suitably at least 10 W/cm·K. Specific examples of the high thermal conductivity material are natural diamond, synthetic diamond by a high pressure and high temperature method and chemical vapor deposited diamond. These are suitable for the high thermal conductivity material. When diamond prepared by the chemical vapor deposition, the high thermal conductivity material having relatively large area can be obtained at a cheap price. The thermal conductivity generally depends on the temperature. The thermal conductivity of diamond decreases, as the temperature increases in the range above the room temperature.

Since the window material is used for the SOR radiation, a conventional window material itself has a temperature increase to about 200° to 500° C. since the irradiated energy is very large. Even if diamond is used, a thermal conductivity of diamond remarkably decreases. However, since the use of the window material of the present invention can give a high heat-dissipating property, a temperature increase of the window material can be prevented and a high thermal conductivity can be maintained. The thickness of the window material is preferably at least 30 μm, more preferably at least 70 μm. The upper limit of the thickness of the window material is usually 10 mm, for example 5 mm.

The flow path typically has a rectangular cross-sectional shape. The height of the flow path present in the high thermal conductivity material is preferably larger due to the increase of the heat exchange efficiency, but the very large height of the flow path disadvantageously gives the poor mechanical strength. The height (c) of the flow path is preferably at least 20 μm, more preferably at least 50 μm. The height (c) of the flow path is preferably at most 90%, more preferably at most 80%, for example at most 70% of the window material thickness. The larger width (a) of the flow path gives the larger heat exchange efficiency, but the very large width disadvantageously gives the smaller heat exchange efficiency due to the decreased number of the flow paths for maintaining the strength of the window material. The space (b) between the flow paths is in the same manner as in the width, and the very large or small space disadvantageously gives the poor results. The width (a) of the flow path and the space (b) between the flow paths are preferably from 20 μm to 10 mm, more preferably from 40 μm to 2 mm, most preferably from 50 μm to 2 mm.

The ratio (a/b) of the width (a) to the space (b) has the lower limit of preferably 0.02, more preferably 0.04 and the upper limit of preferably 10, more preferably 5. The ratio (a/c) of the width (a) to the height (c) has the lower limit of preferably 0.02, more preferably 0.05 and the upper limit of preferably 50, more preferably 25.

The optimum width, space and height are dependent on the ray transmitting in the window material. The cross-sectional shape of the flow path need not be rectangular and may be a semicircular, semioval or complicated shape. In one window material, the values of a, b and c may not be constant and can be varied in the above range. The ratio of window material surface occupied by the flow path (the ratio of surface area occupied by the flow path to window material surface area when viewed from a direction normal to the window material surface) is usually 2 to 75%, preferably 10 to 50% of the surface area of the window material. A angle (taper angle) between the side surface of the flow path and the line normal to the window material surface is preferably at most 300.

The groove for passing the cooling medium can be suitably formed according to the exothermal state of the window material. The flow path is preferably formed so that a part having the highest temperature or a part required to have the lowest temperature is most effectively cooled. The flow path is positioned so that the largest amount of the cooling medium passes in a part required to be most largely cooled. The cooling efficiency can be increased by complicating the cross-sectional shape of the flow path so as to increasing the surface area of the flow path. A part near an inlet for the cooling medium has a high cooling efficiency, since the cooling medium has the lowest temperature. Accordingly, when the heat distribution of the window material is uniform, since a center part has the highest temperature, it is advantageously effective that the inlet is formed in the center part and the cooling flow path is positioned in a spiral or radial shape.

A layer of non-diamond carbon component (for example, graphite or noncrystalline carbon) having the thickness of 1 nm to 1 μm may be present on the surface of the flow path. The non-diamond layer can be prepared by heating the high thermal conductivity material layer at 1000°–1500° C. for 30 minutes to 10 hours (for example, 1 hour) in a non-oxidation atmosphere (for example, in an inert gas atmosphere) (In this case, the non-diamond layer is also formed on the surface of the high thermal conductivity other than flow path, and the non-diamond layer can be removed by a polishing process). The presence and absence of the non-diamond layer can be measured by Raman spectroscopy.

Wettability of the flow path surface by the cooling medium is preferably good. A contact angle is usually at most 65°, more preferably at most 60°. Since a surface of diamond has a hydrogen atom, the surface repels the cooling medium such as water in such state. It is possible to increase the hydrophilic property of the diamond surface layer by substituting the hydrophilic group having the oxygen atom (for example, OH group) for the hydrogen atom.

In order to increase the wettability of the flow path surface, the flow path is annealed at 500°–800° C. for 10 minutes to the 10 hours in an oxidation atmosphere (for example, an atmospheric environment) or processed by a plasma of oxygen or a gas containing oxygen. It is supposed that the hydrophilic property is somewhat increased when an oxygen plasma is used for the formation of the flow path, but the above procedure may be additionally conducted.

The process for improving the wettability of the cooling medium to the flow path surface includes a plasma treatment in a gas containing nitrogen, boron or inert gas.

Specific examples of the cooling medium are water, air, an inert gas (for example, nitrogen and argon), a fluorocarbon, liquid nitrogen, liquid oxygen, and liquid helium.

The window material of the present invention may be adhered to a film other than the high thermal conductivity material [thickness: 0.1 to 10 mm, for example, B, Be, Al, Cu, Si, Ag, Ti, Fe, Ni, Mo and W, an alloy thereof and compound thereof (for example, carbide and nitride)]. The film may be Be, Al and the like for a X-ray transmitting window and Si, ZnSe and the like for a infra-red light transmitting window.

The window of the present invention can be used as a transmitting window for an infra-red light, an ultra-violet light, a X-ray, a SOR radiation and the like.

Hereinafter, a method for preparing the window material having the flow path surrounded by the high thermal conductivity material is explained.

The window material can be prepared by directly perforating the window material to form the flow path by the laser process and the like. The window material can be prepared by forming the groove in one film and attaching said film to another film.

In the former method, a plate comprising the high thermal conductivity material having the desired shape is provided, and the laser light is focused to the side face of the plate for perforation to form the flow path for the cooling medium passage in the high thermal conductivity material plate.

A method of attaching a first high thermal conductivity material film to a second high thermal conductivity material film is explained as follows. The first high thermal conductivity material film has a groove forming a flow path and the second thermal conductivity material film has no groove. A high thermal conductivity material is provided in a desired size. On one surface of the first high thermal conductivity material film, the flow path, which is then embedded in the final window material, is formed by a processing method using laser light or by a selective etching.

The laser processing comprises removing the material by focusing the laser light on the material surface to form the groove on the surface. According to this process, the flow path having the arbitrary positioning can be obtained. The laser light having sufficient energy density is focused on the surface of the high thermal conductivity material film and the focused position is moved while removing the material to form the groove on the surface. Specific examples of the laser light are YAG laser and excimer laser. The excimer laser is preferable, since the groove having the arbitrary height and position can be reproductively formed because of the processing preciseness.

The wave length of the laser light is preferably at most 360 nm, for example 190 to 360 nm. The energy density of the irradiated light is usually from 10 to $10^{11}$ W/cm². A pulse laser light, which preferably has an energy density per one pulse between $10^{-1}$ J/cm² and $10^6$ J/cm² is preferable. The divergence of the laser light generated from the laser generator is preferably from $10^{-2}$ mrad to $5\times10^{-1}$ mrad, and a band width of the laser light is preferably from $10^{-4}$ to 1 nm. A uniformity of the energy distribution in the beam cross-section of the laser light is preferably at most 10%. Good process results can be obtained by focusing the pulse laser light by a cylindrical lens or a cylindrical mirror.

In such flow path formation on the surface by the excimer laser, the processing in the suitable atmosphere can modify the diamond surface and can improve the wettability of the surface by the cooling medium. For example, the above processing in the atmosphere containing an amino group-containing compound (for example, ammonia or hydrazine) can give the amino group on the surface of the formed flow path to increase the hydrophilic property.

The flow path formation by the etching process can be conducted as follows. After a suitable mask is formed on the high thermal conductivity material film, the treatment is conducted under the condition that the mask is not etched and only the high thermal conductivity material is etched. Then the mask is removed to give the first high thermal conductivity material film having the groove on the surface. It is known that the mask material such as Al and $SiO_2$ is formed on diamond and then diamond is selectively etched by oxygen or a gas containing oxygen to form the flow path on diamond (cf. page 411 of volume 11 of Preprint of 53th meeting of the Japanese Applied Physics Society). Nitrogen or hydrogen may be used instead of oxygen or the gas containing oxygen.

The first high thermal conductivity material film having the desired groove is adhered to the separately provided second high thermal conductivity material film to give the window material having the very large heat dissipation efficiency. The second high thermal conductivity material film may provisionally have an inlet and outlet for introducing (and discharging) the cooling medium into the flow path formed in the high thermal conductivity material layer.

Although the method for providing only the first high thermal conductivity material film with the groove is explained in the above, it is possible that the groove is formed also on the second high thermal conductivity material film and a surface of the first high thermal conductivity material film having the groove is adhered to a surface of the second high thermal conductivity material film having the groove. Since this method has a complicated process, it is preferable to form the groove on only the first high thermal conductivity material film.

The adhesion of the first high thermal conductivity material film to the second high thermal conductivity material can be conducted by a metallization treatment or an adhesive. Two adhered surfaces may be metallized by a conventional procedure and the metal may be molten. Specific examples of the metal used in the metallization treatment are Ti, Pt, Au, Sn, Pb, In, Ag and the like. The adhesive (for example, Ag/epoxy, Ag/polyimide and Au/epoxy) or Ag-based wax and other adhesion method may be used. The thickness of the adhesive layer is usually from 0.01 to 10 μm.

When the high thermal conductivity material film is diamond prepared by a chemical vapor deposition process, the selective growth using a mask can be used to form the flow path instead of the laser light or etching process. This is disclosed in Japanese Patent Kokai Publication Nos. 104761/1989 and 123423/1989. A mask material is positioned on the surface of the base material (for example, Si, SiC, Cu, Mo, cBN and the like) in the pattern corresponding to the desired flow path, and diamond is deposited by the chemical vapor deposition. At this time, diamond grows in the vertical and horizontal directions by depositing at least 50 μm of diamond and covers the whole surface of the base material. After the base material is removed, for example, dissolved, the resultant diamond has the flow path on the surface facing the based material. The mask made of Ti, Si, Mo or the like may be prepared by a conventional procedure. The advantage of this method is that diamond does not have a failure at the processing, since the impact is not applied to diamond after growth of the diamond.

In the above method, instead of the formation of the mask, the plate material itself is processed to form the concave and convex corresponding to the flow path and then diamond is grown on the plate material by the chemical vapor deposition. After diamond having the desired thickness is grown, the plate material is removed to give the self-standing diamond film having the flow path on the surface facing the plate material. Specific examples of the plate material are Si, SiC, Mo and the like.

When the chemical vapor deposition diamond is used as the high thermal conductivity material films, the above method is modified so that the step of adhesion can be omitted. Namely, the mask is positioned on a diamond film, diamond is grown on the diamond film by the chemical vapor deposition and then only the mask is dissolved to give the window material having the flow path. According to this method, the heat-dissipation efficiency can be further increased, since the adhesive is absent.

Any of the above methods is effective to prepare the window material having the flow path in the high thermal conductivity material. The method using the etching can precisely form the fine flow path. The method using the laser processing can rapidly form the flow path. The method using the selective growth (the method using the mask) can easily form the relatively large flow path.

The present invention is illustrated with reference to the attached drawings.

FIG. 1 is a schematic plane view of a grooved high thermal conductivity material layer according to the present invention. The high thermal conductivity material 11 has a groove 12 in the form that the surface having no groove is interdigital.

Figure 2:
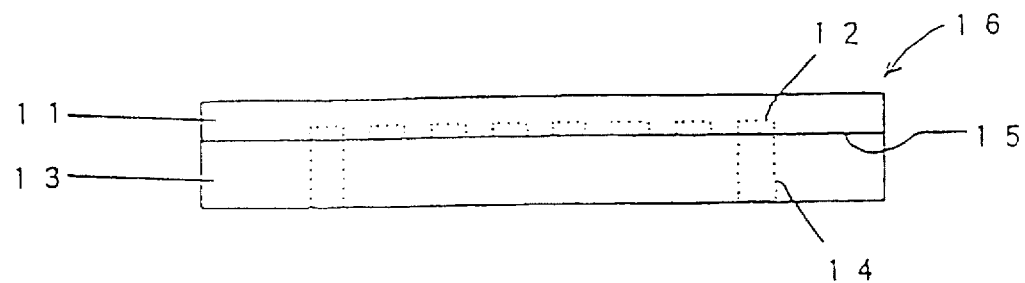
FIG. 2 is a schematic front view of a window material according to the present invention.

FIG. 2 is a schematic front view of a heat-dissipating window material according to the present invention. The heat-dissipating window material 16 comprises a high thermal conductivity material layer 11, a base material 13 and an adhesive layer 15. The base material 13 has two gates 14 for the cooling medium connecting the groove 12. The size and number of the gate 14 in the window material 13 are not limited. For example, each part of the window material corresponding the both ends of groove may have the gate for the cooling medium.

Figure 3:
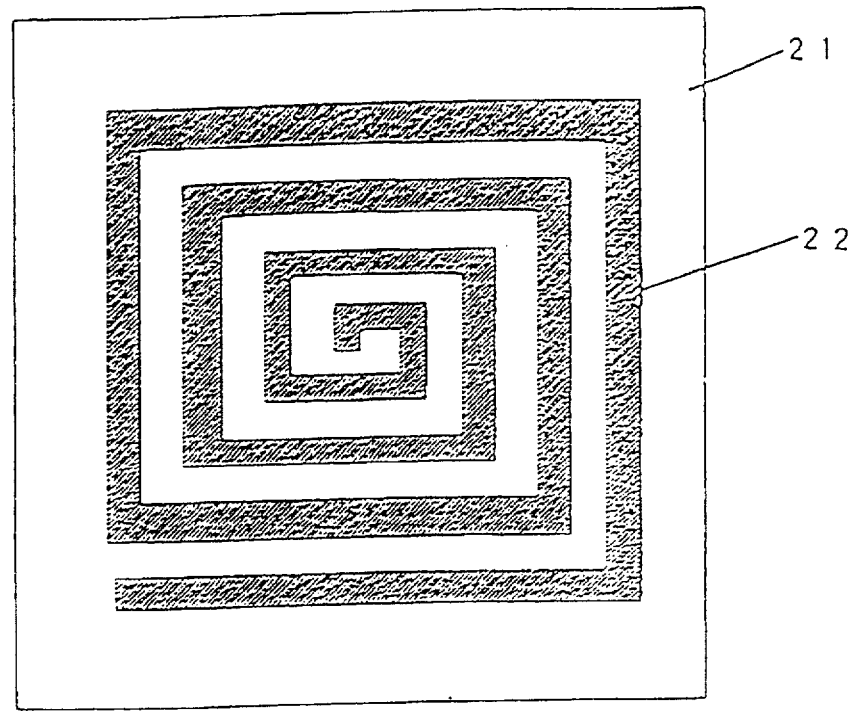
FIG. 3 is a schematic plane view of a high thermal conductivity material layer having a groove according to the present invention.

FIG. 3 is a schematic plane view of a high thermal conductivity material layer according to the present invention. The high thermal conductivity material layer 21 has the spiral groove 22.

Figure 4:
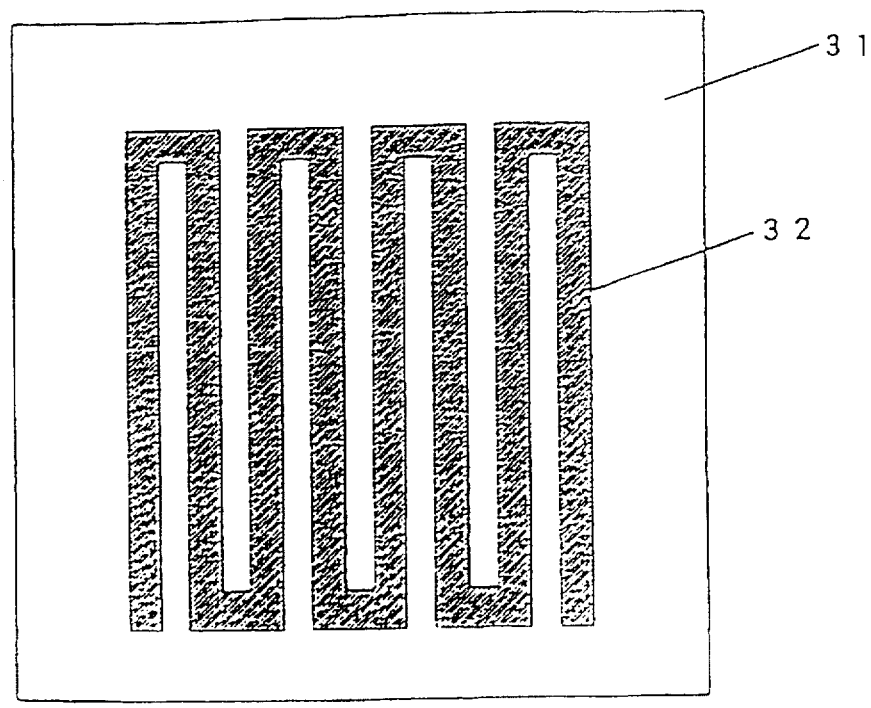
FIG. 4 is a schematic plane view of a heat-dissipating window material comprising a grooved Al layer of Comparative Example 1 excluded from the present invention.

FIG. 4 is a schematic plane view of a grooved Al layer of Comparative Example 1 excluded from the present invention. A groove 32 having the same shape as in FIG. 1 is formed in an Al layer 31.

Figure 5:
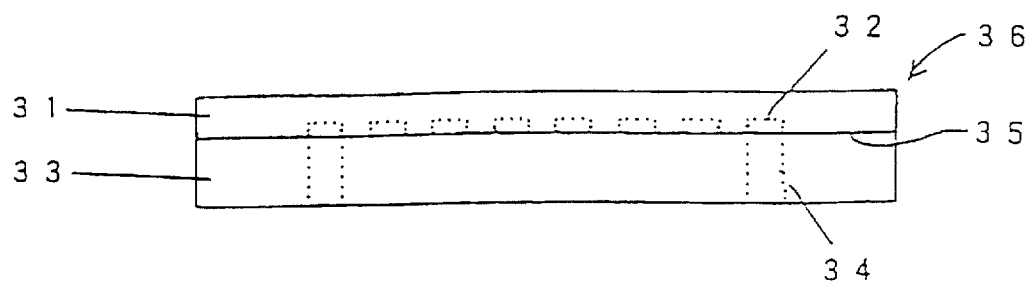
FIG. 5 is a schematic front view of a grooved Al layer of Comparative Example 1 excluded from the present invention.

FIG. 5 is a front view of a heat-dissipating window material comprising a grooved Al layer of Comparative Example 1 excluded from the present invention. The heat-dissipating window material 36 has an Al layer 31, a base material 33 and an adhesive layer 35. The base material 33 has two gates 34 for the cooling medium connecting the groove 32.

Figure 6:
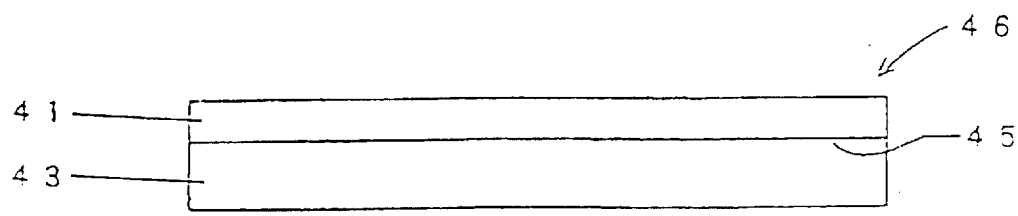
FIG. 6 is a schematic front view of a prior art heat-dissipating window material of Comparative Example 2 excluded from the present invention.

FIG. 6 is a schematic front view of a prior art heat-dissipating window material of Comparative Example 2 excluded from the present invention. A window material 46 comprises a diamond layer 41 having no groove, a base material 43 and an adhesive layer 45.

Figure 7:
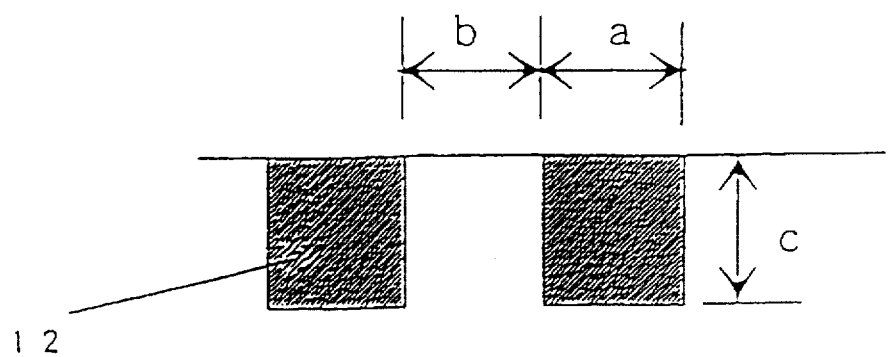
FIG. 7 is a cross-sectional view of a groove formed in a high thermal conductivity material layer according to the present invention.

FIG. 7 is a cross-sectional view of groove formed in a high thermal conductivity material according to the present invention. A groove 12 has a width (a) and a depth (c) and is formed at a space (b).

Figure 8:
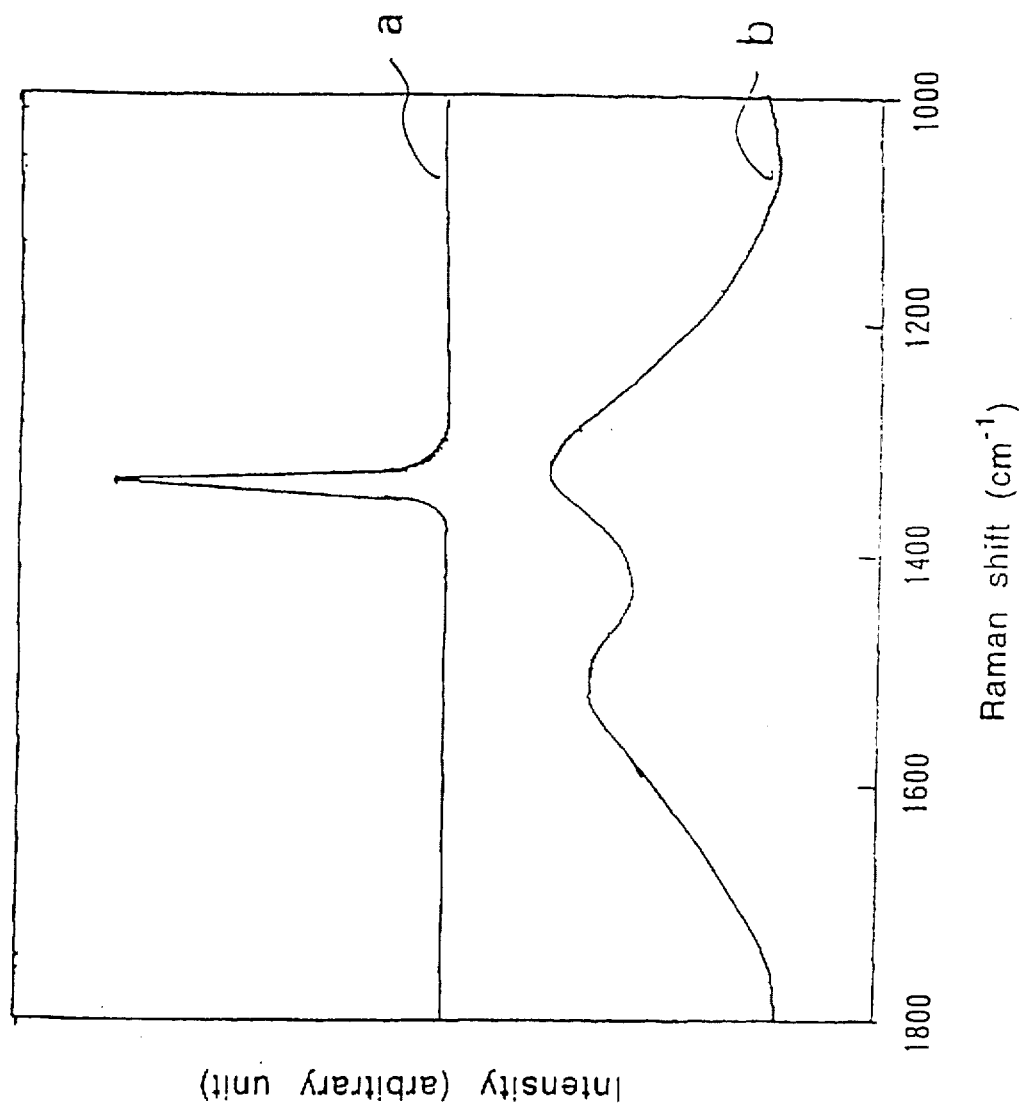
FIG. 8 is Raman spectroscopies of diamond and non-diamond carbon.

FIG. 8 is a Raman spectroscopy of diamond and non-diamond carbon. The curve a is spectrum of diamond, and has a strong peak at 1333 $cm^{-1}$. The curve b is a spectrum of a material largely containing non-diamond carbon and has two broad peaks.

Figure 9:
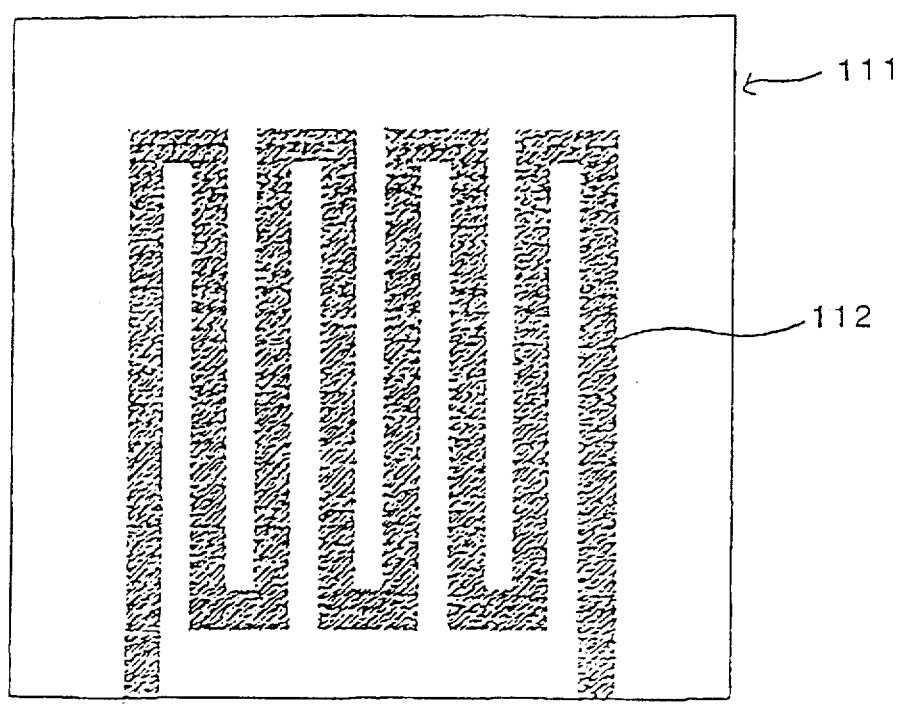
FIG. 9 is a schematic plane view of a window material according to the present invention in which a high thermal conductivity material surrounds a circumference of flow path.

FIG. 9 is a schematic plane view of a window material having a flow path surrounded by a high thermal conductivity material according to the present invention. The window material 111 has a flow path 112. The flow path 112 is embedded in the window material.

Figure 10:
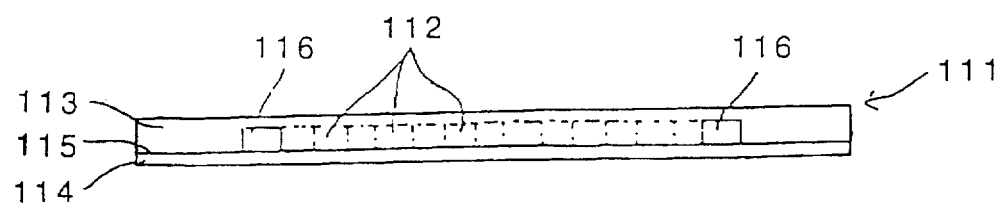
FIG. 10 is a schematic front view of the window material shown in FIG. 9.

FIG. 10 is a schematic front view of the window material shown in FIG. 9. A window material 111 has a first high thermal conductivity material film 113 having a flow path 112, a second high thermal conductivity material film 114 and an adhesive layer 115. The flow path 112 connects to gates 116 for the cooling medium. The gates 116 may be in the other position and, for example, may be positioned on a main surface of the first high thermal conductivity material film 113 or the second high thermal conductivity material film 114. The size and number of the gate are not limited.

Figure 11:
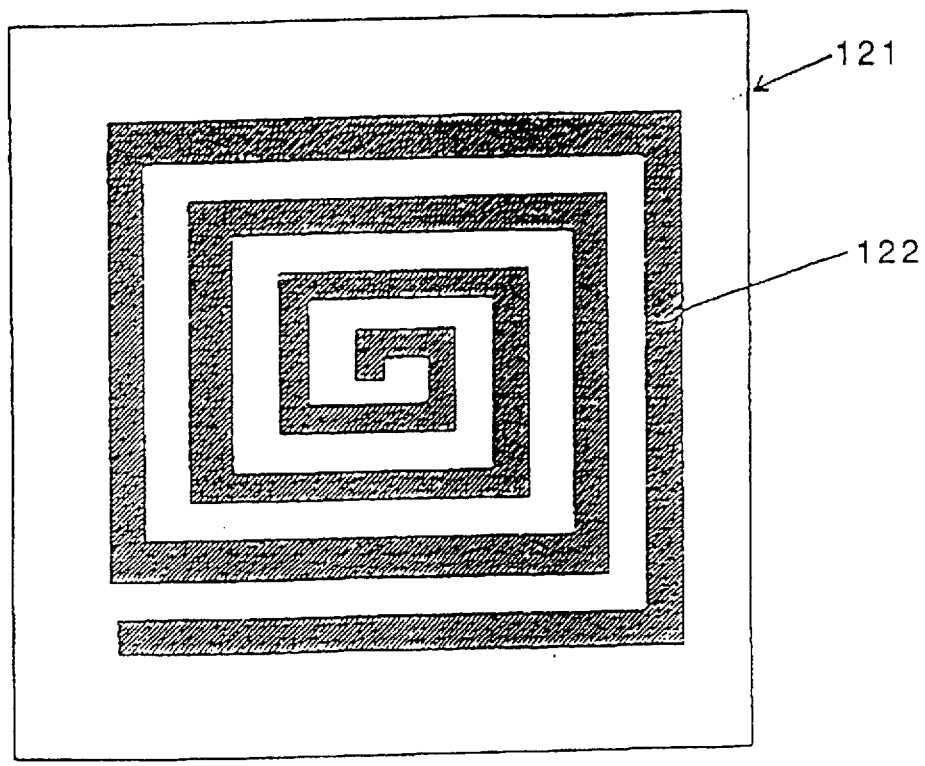
FIG. 11 is a schematic plane view of another embodiment of a window material according to the present invention in which a high thermal conductivity material surrounds a circumference of flow path.

FIG. 11 is a schematic plane view of another embodiment of a window material according to the present invention in which a high thermal conductivity material surrounds a circumference of flow path. A spiral flow path 122 is embedded in the high thermal conductivity material 121.

Figure 12:
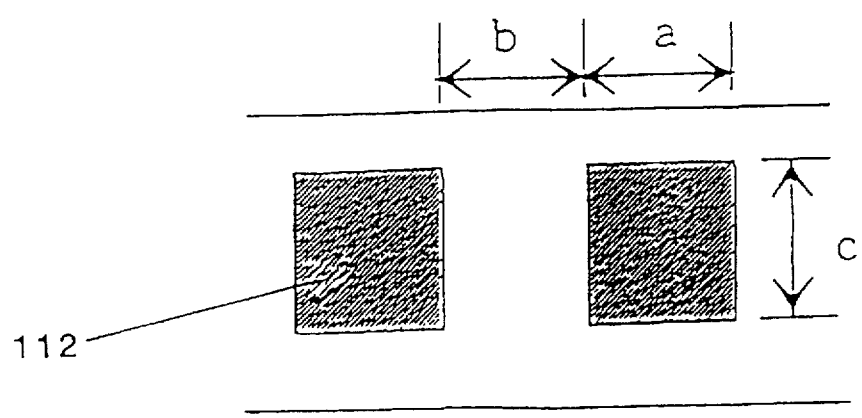
FIG. 12 is a cross-sectional view of a flow path formed in a window material according to the present invention.

FIG. 12 is a cross-sectional view of a flow path formed in a window material according to the present invention. A flow path 112 has a width (a) and a height (c) and is formed at a space (b).

PREFERRED EMBODIMENTS OF THE INVENTION

The present invention is illustrated by the following Examples which do not limit the present invention.

EXAMPLE 1

CVD, groove formation by laser, adhesion

On a scratched polycrystal Si base material (10 mm×10 mm×(thickness) 2 mm), diamond was grown by a microwave plasma enhanced CVD method. The growth conditions included a methane 1%-hydrogen system, a pressure of 80 Torr and a base material temperature of 900° C. After the growth for 400 hours, a growth surface was polished and the Si base material was dissolved in an acid to give a self-standing diamond film having a size of 10 mm×10 mm× (thickness) 0.5 mm. A thermal conductivity was measured to be 17.2 W/cm·K.

On one surface of the resultant self-standing diamond film, a KrF excimer laser was pointedly and linearly focused to form a groove shown in FIG. 1. The groove had a depth of about 150 μm, a width of about 500 μm and a space of about 400 μm. After Ti, Pt and Au were vapor-deposited on both of the diamond film and a Be film, the diamond film was adhered to the Be film. The thickness of a Ti/Pt/Au/Pt/Ti layer was 0.1 μm. The Be film provisionally had gates (diameter: 400 μm) for the cooling medium passing through the groove of diamond (FIG. 2).

In the groove of the resultant window material, a cooling medium fluorocarbon (R-112) (temperature: 25° C.) was supplied. A durability test of the window material for a SOR beam line was conducted. An operation energy of storage ring of an inserted ray source was 500 MeV. The intensity of the SOR beam transmitting in the window material had no change during the test. After the SOR beam was transmitted in the window material for 20 hours, the window material was removed and observed to have no change.

EXAMPLE 2

HPHT synthesis, grooving by laser and adhesion

Using a Ib type diamond (8 mm×8 mm×(thickness) 0.6 mm, thermal conductivity: 18.3 W/cm·K) prepared by a high temperature and high pressure method, a grooved diamond/Be window material was prepared in the same manner as in Example 1, except that the groove formed in diamond by an ArF excimer laser had a depth of about 200 μm, a width of about 350 μm and a space of about 400 μm (cf. FIG. 3). Two holes (circular shape having a diameter of about 350 μm) which were gates for the cooling medium were perforated in the window material by pointedly focusing a KrF excimer laser.

A cooling fluorocarbon (R-112) (temperature: 25° C.) was supplied in the groove of the grooved diamond/Be window material. The SOR beam was transmitted in the window material in the same manner as in Example 1. No change was observed.

COMPARATIVE EXAMPLE 1

Al, grooved

On one surface of Al film (10 mm×10 mm×(thickness) 0.5 mm, thermal conductivity: 2.4 W/cm·K), a KrF excimer laser was linearly focused in the same manner as in Example 1 to form a groove (FIG. 4). The groove had a depth of about 150 μm, a width of about 500 μm and a space of about 400 μm. The grooved Al film was adhered to a Be film to give a window material. The Be film provisionally had gates for a cooling medium passing through the groove of Al (cf FIG. 5).

A cooling fluorocarbon (R-112) (temperature: 25° C.) was supplied in the groove of the resultant window material. The SOR beam was transmitted in the window material in the same manner as in Example 1. After 20 hours, the window material was removed. The window material had an almost molten portion.

COMPARATIVE EXAMPLE 2

CVD, no groove

A chemical vapor deposited self-standing diamond film having a size of 10 mm×10 mm×0.35 mm (thermal conductivity: 17.2 W/cm·K) was prepared in the same manner as in Example 1. Without forming a groove, the diamond film was adhered to a Be film to prepare a window material (cf. FIG. 6). While air having a temperature of 25° C. was blown on the back surface of the window material, the SOR beam was transmitted in the window material in the same manner as in Example 1. After 20 hours, the window material was removed. The window material had a graphite formation due to a temperature increase.

COMPARATIVE EXAMPLE 3

CVD, very narrow groove

A chemical vapor deposited self-standing diamond film having a size of 10 mm×10 mm×0.5 mm (thermal conductivity: 17.2 W/cm·K) was prepared in the same manner as in Example 1. On the diamond film, a KrF excimer laser was linearly focused to form a groove. The groove had a depth of about 150 μm, a width of about 10 μm and a space of about 990 μm. The grooved diamond film was adhered to a Be film (10 mm×10 mm×(thickness) 1 mm) to give a window material. The Be film provisionally had gates for a cooling medium passing through the groove of diamond.

A cooling fluorocarbon (R-112) (temperature: 25° C.) was supplied in the groove of the resultant window material. The SOR beam was transmitted in the window material in the same manner as in Example 1. After 20 hours, the window material was removed. The window material had a black-discolored portion.

EXAMPLE 3

The procedure of Example 1 was repeated to prepare a diamond/Si window material, except that a Si film (10 mm×10 mm×1 mm) was used instead to a Be film.

A cooling fluorocarbon (R-112) (temperature: 25° C.) was supplied in the groove of the resultant window material. An infra-red light having a wave length of 10.6 μm and an output of 8 kW was transmitted in the window material. During the test, the infra-red light transmitted in the window material had no change of intensity. After 20 hours, the window material was removed. No change of the window material was observed.

EXAMPLE 4

The grooved diamond film shown in FIG. 1 was prepared in the same manner as in Example 1. After the diamond film was annealed in air at 600° C. for 30 minutes, the diamond film was adhered to a Be base material in the same manner as in Example 1. A cooling fluorocarbon (R-112) (temperature: 25° C.) was supplied in the groove of the resultant window material. The SOR beam was transmitted in the window material in the same manner as in Example 1. The window material had no change.

EXAMPLE 5

The grooved diamond film shown in FIG. 1 was prepared in the same manner as in Example 1. The diamond film was annealed under vacuum at 1,200° C. for 30 minutes. The Raman spectroscopy of the diamond film was measured. As shown in FIG. 8(b), the peak showing the non-diamond carbon was observed.

The diamond film was adhered to a Be film in the same manner as in Example 1. A cooling fluorocarbon (R-112) (temperature: 25° C.) was supplied in the groove of the resultant window material. The SOR beam was transmitted in the window material in the same manner as in Example 1. The window material had no change.

EXAMPLE 6

CVD, flow path formation by laser, adhesion

Two scratched polycrystal Si base materials (10 mm×10 mm×(thickness) 2 mm) were provided. Diamond was grown on the base material by a microwave plasma enhanced CVD method. The growth conditions included a methane 1%-hydrogen system, a pressure of 80 Torr and a base material temperature of 900° C. After the growth for 300 hours in the case of one base material and for 200 hours in the case of the other base material, a growth surface was polished and the Si base material was dissolved in an acid to give two self-standing diamond films, one film having a size of 10 mm×10 mm×(thickness) 0.3 mm and the other film having a size of 10 mm×10 mm×(thickness) 0.15 mm. A thermal conductivity was measured to be 17.2 W/cm·K (for one film having the thickness of 0.3 mm, referred to as a first self-standing diamond film) and 16.9 W/cm·K (for the other film having the thickness of 0.15 mm, referred to as a second self-standing diamond film).

On one surface of the first self-standing diamond film (having the thickness of 0.3 mm), a KrF excimer laser was pointedly and linearly focused to form a groove shown in FIG. 9. The groove had a depth of about 150 μm, a width of about 500 μm and a space of about 400 μm. After Ti, Pt and Au were vapor-deposited on both of the diamond films, the first self-standing diamond film was adhered to the second self-standing diamond film by melting Au to give a window material (cf. FIGS. 9 and 10). The thickness of a Ti/Pt/Au/Pt/Ti layer was 0.1 μm. A side face of the window material had gates for the cooling medium passing through the groove of diamond.

In the groove of the resultant window material, a cooling medium fluorocarbon (R-112) (temperature: 25° C.) was supplied. A durability test of the window material for a SOR beam line was conducted. An operation energy of storage ring of an inserted light source was 500 MeV. The intensity of the SOR beam transmitting in the window material had no change during the test. After the SOR beam was transmitted in the window material for 20 hours, the window material was removed and observed to have no change.

EXAMPLE 7

HPHT synthesis, a flow path formation by laser, adhesion

Using Ib type diamond prepared by a high pressure and high temperature method [a first self-standing diamond film (8 mm×8 mm×(thickness) 0.4 mm, thermal conductivity 18.3 W/cm·K) and a second self-standing diamond film (8 mm×8 mm×(thickness) 0.2 mm, thermal conductivity 18.3 W/cm·K), a diamond window material having a flow path was prepared in the same manner as in Example 6. On one surface of the first self-standing diamond film, a ArF excimer laser was focused to form a groove shown in FIG. 11 and the groove had a depth of about 200 μm, a width of about 350 μm and a space of about 400 μm. Two holes (a circular shape having a diameter of about 350 μm) corresponding to the gates for a cooling medium passing through the flow path were prepared by a pointedly focused KrF excimer laser.

In the groove of the resultant window material, a cooling medium fluorocarbon (R-112) (temperature: 25° C.) was supplied. A durability test of the window material for a SOR beam line was conducted. An operation energy of storage ring of an inserted light source was 500 MeV. The intensity of the SOR beam transmitting in the window material had no change during the test. After the SOR beam was transmitted in the window material for 20 hours, the window material was removed and observed to have no change.

COMPARATIVE EXAMPLE 4

Al, presence of flow path

On one surface of a first self-standing Al film (10 mm×10 mm×(thickness) 0.5 mm, thermal conductivity: 2.4 W/cm·K), a KrF excimer laser was focused in the same manner as in Example 6 to form a groove. The groove had a depth of about 150 μm, a width of about 500 μm and a space of about 400 μm. The first self-standing Al film was adhered to a second self-standing Al film (10 mm×10 mm×(thickness) 0.3 mm, thermal conductivity: 2.4 W/cm·K) to give a window material having a flow path.

A cooling fluorocarbon (R-112) (temperature: 25° C.) was supplied in the groove of the resultant window material. A SOR beam was transmitted in the window material in the same manner as in Example 6. After 20 hours, the window material was removed. The window material had an almost molten portion.

COMPARATIVE EXAMPLE 5

A chemical vapor deposited self-standing diamond film having a size of 10 mm×10 mm×0.5 mm (thermal conductivity: 17.2 W/cm·K) was prepared in the same manner as in Example 6. A SOR beam was transmitted in the film (window material) in the same manner as in Example 6. After 20 hours, the window material was removed. The window material had a graphite portion due to a temperature increase.

COMPARATIVE EXAMPLE 6

CVD, very narrow flow path

A first self-standing diamond film (size: 10 mm×10 mm×0.3 mm, thermal conductivity: 17.2 W/cm·K) and a second self-standing diamond film (size: 10 mm×10 mm×0.15 mm, thermal conductivity: 17.2 W/cm·K) were prepared by a chemical vapor deposition in the same manner as in Example 6. On the first diamond film, a KrF excimer laser was focused in the same manner as in Example 6 to form a groove as shown in FIG. 9. The groove had a depth of about 150 μm, a width of about 10 μm and a space of about 990 μm. The grooved first self-standing diamond film was adhered to the second self-standing diamond film to form a diamond window material.

A cooling fluorocarbon (R-112) (temperature: 25° C.) was supplied in the groove of the resultant window material. A SOR beam was transmitted in the window material in the same manner as in Example 6. After 20 hours, the window material was removed. The window material had a black-discolored portion.

EXAMPLE 8

Annealing in air

A grooved first self-standing diamond film and a second self-standing diamond film were prepared in the same manner as in Example 6. The first self-standing diamond film was positioned in an atmospheric oven and annealed in air at 600° C. for 30 minutes. Then, the first self-standing diamond film was adhered to the second self-standing diamond film in the same manner as in Example 6 to prepare a diamond window material.

Cooling water (temperature: 25° C.) was supplied in the flow path of the resultant channeled window material. A durability test of the window material for a SOR beam line was conducted in the same manner as in Example 6. The intensity of the SOR beam transmitting in the window material had no change during the test. After the SOR beam was transmitted in the window material for 20 hours, the window material was removed and observed to have no change.

EXAMPLE 9

Annealing under vacuum

A grooved first self-standing diamond film and a second self-standing diamond film were prepared in the same manner as in Example 6. The first self-standing diamond film was positioned in a vacuum oven and annealed under vacuum at 1,200° C. for 30 minutes. The Raman spectroscopy of the first self-standing diamond film was measured. As shown in FIG. 8(b), the peak which shows the non-diamond material was observed. Then, the first self-standing diamond film was adhered to the second self-standing diamond film in the same manner as in Example 6 to prepare a diamond window material.

Cooling water (temperature: 25° C.) was supplied in the flow path of the resultant channeled window material. A durability test of the window material for a SOR beam line was conducted in the same manner as in Example 6. The intensity of the SOR beam transmitting in the window material had no change during the test. After the SOR beam was transmitted in the window material for 20 hours, the window material was removed and observed to have no change.

EXAMPLE 10

A self-standing diamond film having a size of 10 mm×10 mm×(thickness) 0.25 mm was obtained in the same manner as in Example 1. On one surface of the diamond film, a mask pattern of Al having a width of 100 µm and a space of 50 µm was provided. The diamond film was plasma etched by a mixture gas of argon and oxygen. The plasma etching was conducted for 3 hours under at an oxygen content of 20%, a total pressure of 0.05 Torr and a RF output power of 200 W. Then the Al mask was removed by dissolving in an acid to give a grooved self-standing diamond film having a depth of 50 µm, a width of 50 µm and a space of 100 µm.

The diamond film was adhered to a Be base material (10 mm×10 mm×(thickness) 3 mm) to give a window material (A metallization of Ti/Pt/Au was conducted on a circumference of the base material and then an Ag-based wax was brazed.). The window material was used as a window for a synchrotron radiation (SOR) beam line (500 MeV). A cooling fluorocarbon (R112) (temperature: 25° C.) was supplied in the flow path of the window material. After the radiation for 10 hours, no change of the window material was observed.

EFFECT OF THE INVENTION

The window material according to the present invention has a high heat-dissipating property and a high transmittance. It has a significant effect, when the window material is used as a window for a ray having a high luminance which cannot be successfully dealt with a conventional window material.

The method of preparing the window material according to the present invention can easily give the window material having the high heat dissipating property.

What is claimed is:

1. A window material comprising a layer of a high thermal conductivity material having a thermal conductivity of at least 10 W/cm·K and positioned on a base material, wherein a flow path for passing a cooling medium is provided only in the high thermal conductivity material layer adjacent an interface between the base material and the high thermal conductivity material layer.

2. The window material according to claim 1, wherein the high thermal conductivity material layer is diamond.

3. The window material according to claim 2, wherein the diamond is prepared by a chemical vapor deposition.

4. The window material according to claim 1, wherein a depth of the flow path for passing the cooling medium is at least 50 µm and at most 90% of the high thermal conductivity material layer.

5. The window material according to claim 1, wherein a width of the flow path for passing the cooling medium is from 20 µm to 10 mm.

6. The window material according to claim 1, wherein a space between the flow paths for passing the cooling medium is from 20 µm to 10 mm.

7. The window material according to claim 1, wherein a ratio of a width (a) of the flow path to a space (b) between the flow paths is such that $0.02 \leq (a/b) \leq 10$.

8. The window material according to claim 1, wherein the flow path for passing the cooling medium is positioned radially or spirally from a center part of the window material toward a circumferential part of the window material.

9. The window material according to claim 1, wherein a surface of the flow path for passing the cooling medium is treated so as to increase wettability to the cooling medium.

10. A window material comprising at least one flow path for passing a cooling medium which flow path is embedded in a plate made of a high thermal conductivity material having a thermal conductivity of at least 10 W/cm·K.

11. The window material according to claim 10, wherein the high thermal conductivity material layer is diamond.

12. The window material according to claim 11, wherein the diamond is prepared by chemical vapor deposition.

13. The window material according to claim 10, wherein a depth of the flow path for passing the cooling medium is at least 50 µm and at most 90% of the high thermal conductivity material layer.

14. The window material according to claim 10, wherein a width of the flow path for passing the cooling medium is from 20 µm to 10 mm.

15. The window material according to claim 10, wherein a space between adjacent flow paths for passing the cooling medium is from 20 µm to 10 mm.

16. The window material according to claim 10, wherein a ratio of a width (a) of the flow path to a space (b) between the flow paths is such that $0.02 \leq (a/b) \leq 10$.

17. The window material according to claim 10, wherein the flow path for passing the cooling medium is positioned radially or spirally from a center part of the window material toward a circumferential part of the window material.

18. The window material according to claim 10, wherein a surface of the flow path for passing the cooling medium is treated so as to increase the wettability to the cooling medium.

19. A method of preparing a window material which comprises steps of
   a) conducting a laser light treatment on one main surface of a plate comprising a high thermal conductivity material having a thermal conductivity of at least 10 W/cm·K to form a flow path for passing a cooling medium in said surface, and
   b) adhering said treated surface to a base material.

20. The method according to claim 19, wherein the laser light is an excimer laser light.

21. The method according to claim 19, wherein the high thermal conductivity material is diamond.

22. The method according to claim 21, wherein the diamond is prepared by a chemical vapor deposition process.

23. The method according to claim 19, which further comprises a step of treating a surface of the flow path for passing the cooling medium so as to increase wettability by the cooling medium.

24. A method of preparing a window material which comprises steps of
   a) conducting a laser light treatment on one main surface of a plate comprising a high thermal conductivity material having a thermal conductivity of at least 10 W/cm·K to form a flow path for passing a cooling medium in said surface, and
   b) adhering said treated surface to another plate comprising a high thermal conductivity material having a thermal conductivity of at least 10 W/cm·K.

25. A method of preparing a window material which comprises a step of conducting a laser light treatment on a side surface of a plate comprising a high thermal conductivity material having a thermal conductivity of at least 10 W/cm·K to form a flow path for passing a cooling medium.

26. A method of preparing a window material which comprises steps of
   a) providing a mask partially on one main surface of a plate comprising a high thermal conductivity material having a thermal conductivity of at least 10 W/cm·K,
   b) selectively etching a portion of the surface having no mask to form a flow path for passing a cooling medium,
   c) removing the mask, and
   d) adhering the etched surface to a base material.

27. The method according to claim 26, wherein the base material is a plate comprising a high thermal conductivity material having a thermal conductivity of at least 10 W/cm·K.

28. The method according to claim 26, wherein the step of selectively etching the portion having no mask is conducted by a plasma of oxygen or a reactive gas containing oxygen.

29. A method of preparing a window material which comprises steps of
   a) forming a groove on a plate material,
   b) growing diamond by a chemical vapor deposition on the plate material,
   c) removing the plate material to provide a grooved self-standing diamond film, and
   d) adhering the grooved surface of the diamond film to a base material.

30. The method according to claim 29, wherein the base material is a self-standing diamond film.

31. A method for preparing a window material which comprises steps of:
   a) providing a mask on a base material,
   b) growing diamond by chemical vapor deposition of diamond on the base material, and
   c) removing the mask to provide a flow path in the diamond for passing a cooling medium.

32. A method for preparing a window material which comprises steps of:
   a) providing a mask on a plate material,
   b) growing diamond by chemical vapor deposition of diamond on the plate material,
   c) removing the mask and the plate material to provide a self-standing diamond film having a grooved surface, and
   d) adhering the grooved surface of the diamond film to a base material.

* * * * *